(12) United States Patent
Hurwitt

(10) Patent No.: US 6,464,841 B1
(45) Date of Patent: Oct. 15, 2002

(54) CATHODE HAVING VARIABLE MAGNET CONFIGURATION

(75) Inventor: Steven Hurwitt, deceased, late of Park Ridge, NJ (US), by Anne Hurwitt, executrix

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 08/812,091

(22) Filed: Mar. 4, 1997

(51) Int. Cl.⁷ .............................................. C23C 14/35
(52) U.S. Cl. ......................... 204/192.12; 204/192.13; 204/298.03; 204/298.2; 204/298.19
(58) Field of Search .................. 204/192.12, 192.13, 204/298.03, 298.16, 298.17, 298.19, 298.2

(56) References Cited

U.S. PATENT DOCUMENTS

| 4,595,482 A | * | 6/1986 | Mintz ..................... 204/298.03 |
| 4,714,536 A | * | 12/1987 | Freeman et al. .......... 204/298.2 |
| 5,130,005 A | | 7/1992 | Hurwitt et al. |
| 5,182,003 A | | 1/1993 | Maass et al. ........... 204/298.23 |
| 5,188,717 A | * | 2/1993 | Broadbent et al. ..... 204/192.12 |
| 5,314,597 A | * | 5/1994 | Harra ..................... 204/298.2 |
| 5,455,197 A | * | 10/1995 | Ghanbari et al. ...... 204/298.03 |
| 5,514,257 A | * | 5/1996 | Kobayashi et al. .... 204/192.17 |

FOREIGN PATENT DOCUMENTS

| DE | 2707144 | * | 8/1977 |
| EP | 0248244 | | 12/1987 |
| EP | 0620583 | | 10/1994 |
| WO | 9207970 | | 5/1992 |

OTHER PUBLICATIONS

PCT Search Report, Dated Sep. 6, 1999.

* cited by examiner

Primary Examiner—Rodney G. McDonald
(74) Attorney, Agent, or Firm—Wood, Herron & Evans, L.L.P.

(57) ABSTRACT

A sputtering system for depositing a thin film onto a substrate is disclosed wherein the system includes an evacuatable chamber which includes the substrate. In particular, the system includes a target positioned within the chamber, wherein the target has a back surface and a sputtering surface. Further, the system includes plasma for eroding the target to provide material for forming the thin film wherein erosion of the target occurs in a predetermined erosion pattern and is controlled by a shape of the plasma. The system also includes a support for supporting the substrate opposite the sputtering surface. A magnet arrangement is provided which provides a magnetic field on the target for controlling the shape of the plasma, wherein the magnet arrangement is positioned adjacent the back surface. The magnet arrangement includes a plurality of magnet segments which may be moved into desired positions so as to change the shape of the magnet arrangement. This enables adjustment of a dwell time of the magnetic field over predetermined portions of the target to change the shape of the plasma and thus change the erosion pattern of the target.

19 Claims, 7 Drawing Sheets

CATHODE HAVING VARIABLE MAGNET CONFIGURATION

The disclosure of U.S. Pat. No. 5,130,005 entitled MAGNETRON SPUTTER COATING METHOD AND APPARATUS WITH ROTATING MAGNET CATHODE filed Dec. 13, 1990 is hereby incorporated by reference.

FIELD OF THE INVENTION

The present invention relates to a cathode used in a sputtering process, and more particularly, to a sputtering cathode assembly with a variable magnetic configuration that compensates for variations in deposition film thickness caused by erosion of a sputtering target.

BACKGROUND OF THE INVENTION

In a sputtering process, sputtering cathode assemblies are commonly used to deposit metal or other conductive material as a thin film onto a surface of a substrate such as a semiconductor wafer. Sputtering cathode assemblies include a vacuum chamber in which a sputtering target is positioned in close proximity to the substrate. As energy is applied to the target, atoms are ultimately sputtered or dislodged from the surface of the target and deposited on substrate.

Frequently, non-uniformities in a film are a result of there being more of a target structure (i.e. a sputtering source) located near a center of a substrate than at an outer edge of the substrate. In theory, with all other parameters being equal, an infinitely large target with a uniform erosion profile would be capable of overcoming film non-uniformity due to the target size. Therefore, it is desirable to make the target large with respect to the surface of the substrate being coated. There are, however, practical limitations on the size of the sputtering target which may be used. Usually, a compromise is made by providing a target having a diameter that is approximately one-half larger than that of the substrate being coated. Nonetheless, with this compromise, use of a target which is eroded uniformly still results in the formation of a film whose thickness increases when moving from the edge of the substrate toward the center of the substrate.

In many commercial processes, such as those where a high rate of deposition is a consideration, magnetron enhanced plasma generation and shaping techniques are utilized to establish a desired erosion profile of the sputtering target. More recently, sputter coating equipment manufacturers have provided sputter coating target and cathode assemblies in which rotating magnet packages are used to assist in magnetron enhancement of the plasma. One such rotating magnet cathode assembly is described and illustrated in U.S. Pat. No. 5,130,005 entitled MAGNETRON SPUTTER COATING METHOD AND APPARATUS WITH ROTATING MAGNET CATHODE which is assigned to Materials Research Corporation.

Designs for cathode assemblies have been optimized to shape the erosion profiles of the targets to compensate for the thinner edge coating effect and other factors contributing to non-uniformity of the film. This is frequently achieved by selectively configuring the magnet assemblies used to shape the plasma. For example, in order to compensate for thinness of a film at the substrate edge, magnet assemblies are often designed to produce a greater duration of plasma around the target edge. This causes the target to erode at a higher rate near the target edge to compensate for reduced target exposure near the substrate edge.

Referring to FIGS. 1 and 2, a rotating magnet assembly is shown. A magnet carrier plate 20 is arranged to be rotatable around center axis 26 on shaft 18. The plate 20 includes an array of magnetic material 28 having a fixed predetermined shape. In particular, the magnetic material 28 is selectively configured so that there are portions positioned at various radii from the center axis 26 in an irregular partially-formed loop. In this configuration, magnetic material 28 is oriented such that a north magnetic pole is at an outer perimeter face 32 while a south magnetic pole is at inner perimeter face 34. The shape of the sputtering plasma and the resultant erosion of first target 72 adjacent magnetic material 28 is defined by a magnetic flux path 76 extending between the north 32 and south 34 magnetic poles which create a closed loop magnetic field tunnel on the face of the first target 72.

When the magnetic material 28 is rotated with respect to first target 72, an erosion profile 74 is formed in first target 72. The profile 74 includes a substantially circular "bulls eye" pattern wherein the deeper and shallower portions of profile 74 are formed by the particular pattern shape of magnetic material 28. A first outermost portion 78 of profile 74 is dominated by a rotational dwell of outermost areas 79 of the magnetic material 28, while the depth of erosion of a central portion 82 of the first target 72 is dominated by center areas 84 of magnetic material 28. Similarly, an erosion of an intermediate portion 86 between the first outermost portion 78 and the center portion 82 results from a rotational dwell of intermediate areas 88 of magnetic material 28.

The shape of the profile 74, in addition to other factors such as the size of the first target 72 and substrate 92 and the spacing between first target 72 and substrate 92 are some factors which determine film thickness uniformity. Further, thickness uniformity is not constant during the life of the target. When first target 72 is new, an initial sputtering surface 90 is substantially flat and at a known distance from the substrate 92 which is to be coated with sputtered material. As erosion progresses, the surface 90 gradually assumes the shape of profile 74. Together with the erosion, the distance between the surface 90 and substrate 92 increases.

The effect of these changes is shown in FIG. 3. FIG. 3 illustrates sputtered material thickness across a diameter of a six-inch substrate. Curve 94 illustrates sputtered material thickness obtained when first target 72 is new and surface 90 is substantially flat. As target erosion progresses, uniformity degrades as illustrated by curve 96 at the mid-point of target life. As first target 72 approaches the end of life, the thickness of sputtered material degrades to that illustrated by curve 98. The progression of sputtered material thickness as first target 72 erodes, indicates a reduction of film thickness towards the edge of substrate 92.

These deficiencies may be corrected by periodically replacing the magnetic material 28 with magnetic material having a different shape adapted to provide a higher dwell time in the outermost areas 79, thereby causing increased sputtering in the first outermost portion 78 of the first target 72. However, replacement of magnetic material 28 requires removal of the plate 20 and shutdown of sputtering system, resulting in increased costs and reduced productivity.

Further, it is known that sputtering targets of different materials or crystal structures perform differently in the sputtering process. Referring to FIG. 4A, an angular distribution of material 120 sputtered from a location 122 on a second target 124 fabricated from aluminum is illustrated. This distribution shows that a majority of material sputtered is located predominantly normal to the target surface. Referring to FIG. 4B, an angular distribution of material 132 sputtered from a location 126 on a third target 128 fabricated from terbium or gold is shown. Here the sputtered material is distributed at lower angles along lobes 130 than that shown in FIG. 4A. Optimizing the deposition uniformity for these and other materials requires replacement of the magnet structure. However, as previously described, this requires undesirable shutdown of the sputtering system.

SUMMARY OF THE INVENTION

A sputtering system for depositing a thin film onto a substrate is disclosed wherein the system includes an evacuatable chamber which includes the substrate. In particular, the system includes a target positioned within the chamber, wherein the target includes a back surface and a sputtering surface. Further, the system includes plasma for eroding the target to provide material for forming the thin film wherein erosion of the target occurs in a predetermined erosion pattern and is controlled by a shape of the plasma. In addition, a magnet arrangement is provided which provides a magnetic field on the target for controlling the shape of the plasma, wherein the magnet arrangement is positioned adjacent the back surface. The system also includes a support for supporting the substrate opposite the sputtering surface and an adjustment arrangement for adjusting a dwell time of the magnetic field over predetermined portions of the target to change the shape of the plasma to thereby change the erosion pattern of the target.

DETAILED DESCRIPTION OF THE INVENTION

Figure 1:
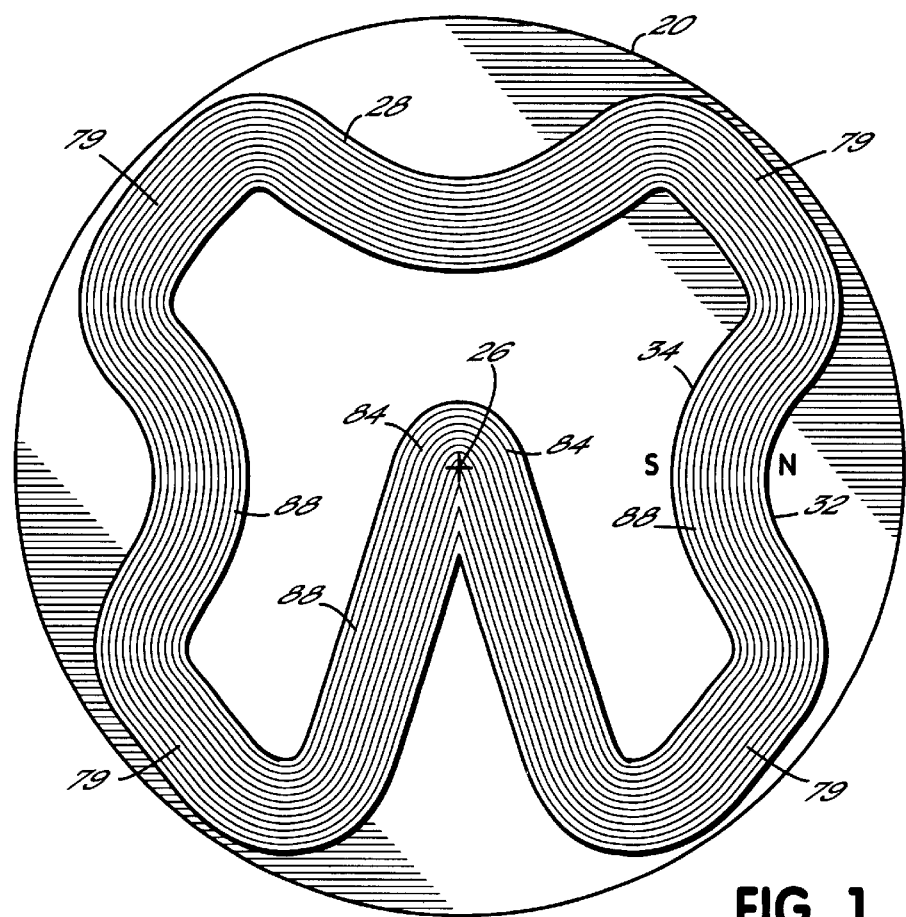
FIG. 1 depicts a conventional rotating magnet assembly.
Figure 2:
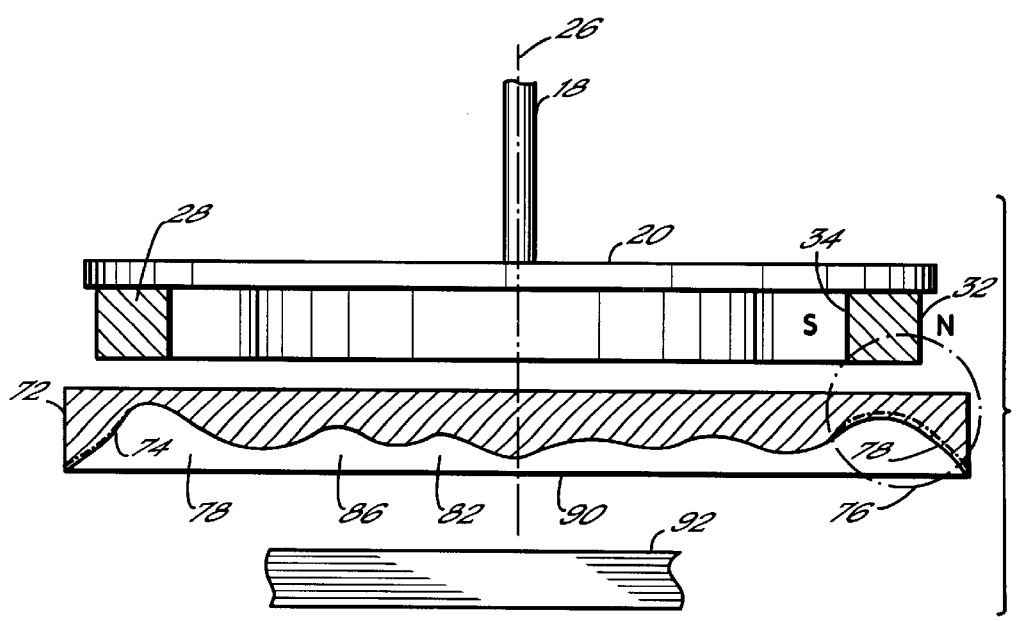
FIG. 2 illustrates a side view of a conventional rotating magnet assembly and a target erosion profile.
Figure 3:
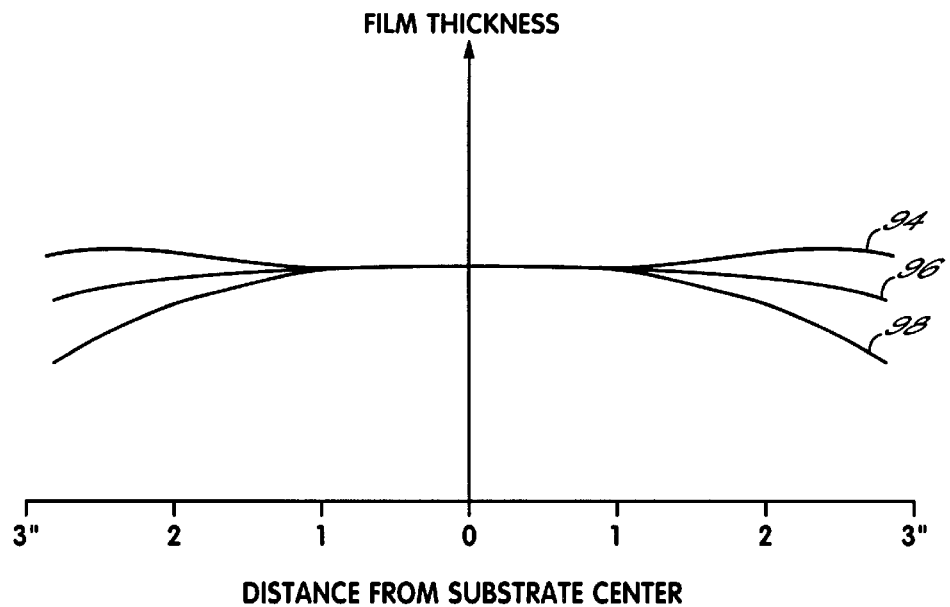
FIG. 3 shown film uniformity at various stages of target life.
Figure 4A:
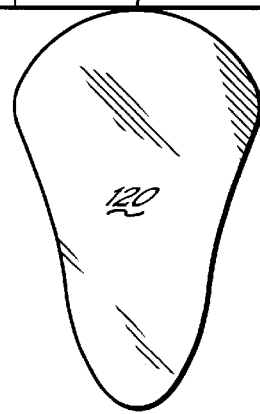
FIG. 4A illustrates angular distribution of material sputtered from an aluminum target.
Figure 4B:
FIG. 4B illustrates angular distribution of material sputtered from an aluminum target.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in FIGS. 1–10.

Figure 5:
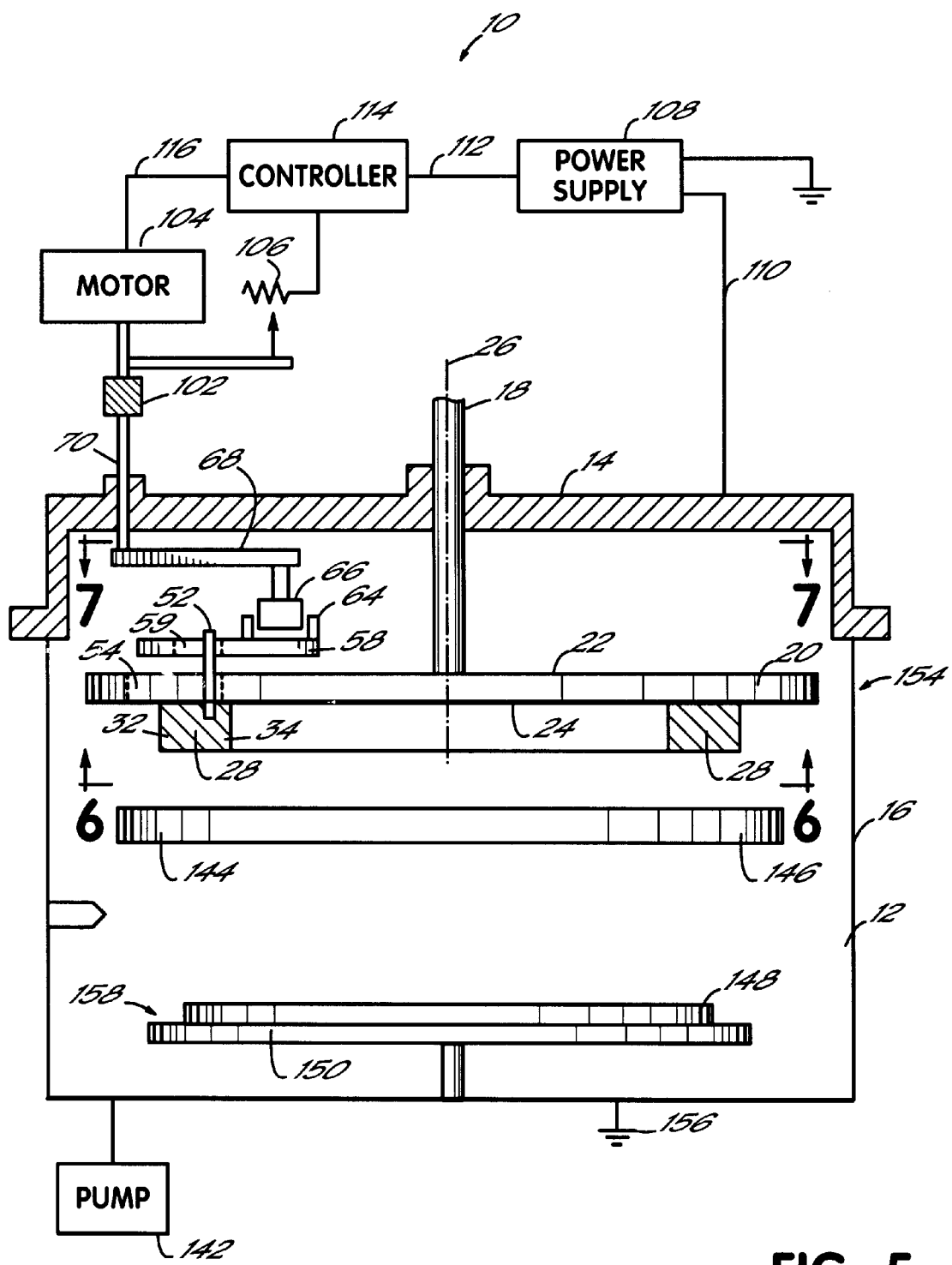
FIG. 5 is a view of a sputtering system having a variable magnet cathode in accordance with the present invention.

Referring now to FIG. 5, a sputtering system 10 in accordance with the present invention is shown. The system 10 includes a stationary cover 14 which is removably affixed to a bottom housing 16 to form a cavity 12. The cavity 12 is evacuated by a pump 142 to a vacuum level suitable for sputtering. A fourth target 144 is positioned within the cavity 12. The fourth target 144 includes a sputtering surface 146 from which target material is removed and which is ultimately deposited on a substrate 148 to form a thin film. The system 10 also includes a support 150 for holding the substrate 148 in a position generally opposite the sputtering surface 146. In use, a sputtering gas, such as argon, is introduced into the cavity 12 through a nozzle 152. The fourth target 144 is then negatively energized by a power supply 108 to cause an 10 emission of electrons from the fourth target 144, thus forming a cathode element 154. Further, the support 150 and substrate 148 are connected to ground 156 to form an anode element 158.

Figure 6:
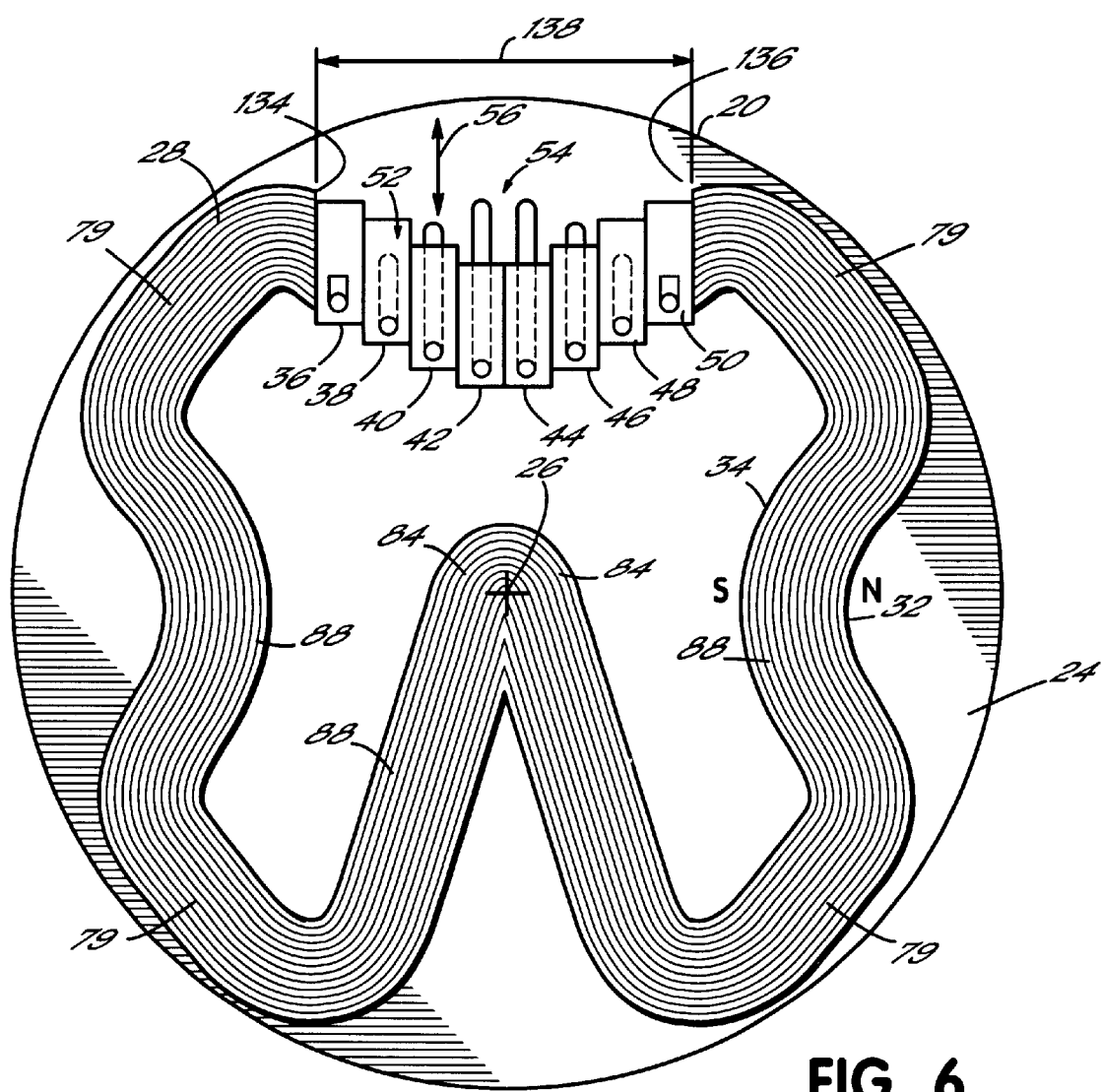
FIG. 6 is a partial view of the system along view line 6—6 of FIG. 5 and which depicts magnetic segments.

Projecting through stationary cover 14 is a shaft 18. A magnet carrier plate 20, made from non-magnetic stainless steel or other such material, is attached at the interior end of shaft 18 and is disposed within cavity 12 substantially parallel to stationary cover 14. Plate 20 has a first surface 22 to which shaft 18 is attached and a second surface 24 to which magnetic material 28 is attached. Plate 20 rotates about the center axis 26 of shaft 18. An exterior end of shaft 18, that is, the end of shaft 18 exterior to cavity 12, is coupled to a drive motor (not shown) which rotates shaft 18 at a selected speed. Reference is now made to FIG. 6 which is a partial view of the system 10 along line 6—6 of FIG. 5. In accordance with the present invention, a portion of the magnetic material 28, which is not located in the outermost areas 79, is removed to form first 134 and second 136 ends which are separated by a gap 138. A plurality of magnetic segments 36–50 are disposed in the gap 138 between the first 134 and second 136 ends. The magnetic segments 36–50 are arranged in a shape which is similar to the shape of the portion of the magnetic material 28 which is removed. It is understood however, that the magnetic segments 36–50 may be arranged in other shapes as desired.

Each of the magnetic segments 38–48 is positioned such that each is substantially in contact with adjacent magnetic segments. Further, magnetic segments 36 and 50 are substantially in contact with the adjacent magnetic segment 38 and 48, respectively, on one side and in contact with the first 134 and second 136 ends, respectively, on the opposite side. The magnetic segments 36–50 are of the same magnetic orientation as the magnetic material 28. Further, the magnetic material 28 may include any known magnetic material, including metal or electromagnets, sufficient to generate suitable magnetic field strength to enhance the sputtering process.

Figure 7:
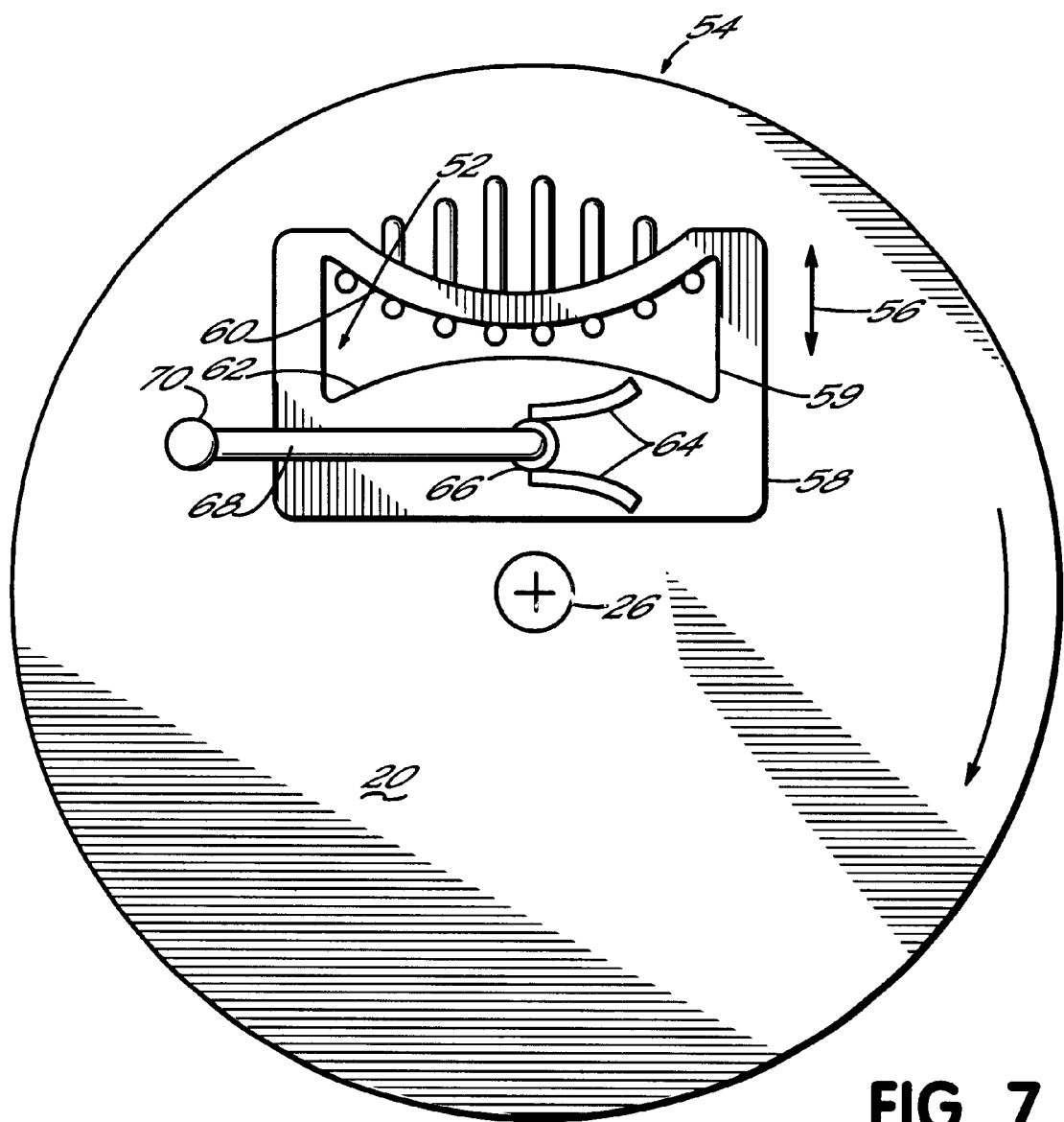
FIG. 7 is a partial view of the system along view line 7—7 of FIG. 5 and which depicts a yoke in an innermost position relative to a center axis.

Referring to FIG. 7 in conjunction with FIG. 5, a partial view of the system 10 along line 7—7 of FIG. 5 is shown. Each of the magnetic segments 36–50 has a perpendicularly extending pin 52 projecting through a corresponding one of a plurality of slots 54 in plate 20. The slots 54 control movement of each of the pins 52 and thus the magnetic segments 36–50 in the direction of arrow 56. The system 10 further includes a yoke 58 which is adapted to slide on plate 20 in the direction indicated by arrow 56. Yoke 58 includes spaced apart and opposed upper 60 and lower 62 convex surfaces to form an hourglass-shaped aperture 59. The upper 60 and lower 62 surfaces are engagable with a portion of each of the pins 52 projecting through plate 20. Initially, the upper surface 60 is located in an innermost position, that is, closest to the center axis 26. This results in contact between each of the pins 52 and the upper surface 60, thus positioning the pins in an arc-shaped configuration corresponding to the upper surface 60. In this position, the magnetic segments 36–50 are configured as previously described in relation to FIG. 6. As such, the magnetic segments 36–50, in conjunction with the magnetic material 28, are adapted to provide film thickness uniformity which is substantially similar to that indicated by curve 94 in FIG. 3 for a new sputtering target.

Yoke 58 includes a pair of guides 64 having an arcuate shape. The guides 64 are positioned such that first ends of each of the guides 64 are spaced further apart than second ends to form a funnel arrangement. In addition, the system 10 includes a roller 66 which is rotatably attached to a shaft 70. The guides 64 serve to capture the roller 66 during each rotation of plate 20. Shaft 70 is offset from center axis 26 such that rotation of shaft 70 swings arm 68 through a limited arc. As such, clockwise rotation of the shaft 70 moves the roller 66 closer to the center axis 26 whereas counterclockwise rotation moves the roller 66 farther from the center axis 26. This causes a corresponding upward or downward movement of the yoke 58 in accordance with the position of the roller 66. The position of pins 52 and yoke 58 is maintained by friction during the portion of the rotation of plate 20 when roller 66 is not engaged by guides 64. In accordance with the present invention, this enables periodic adjustment of the magnetic segments 36–50 relative to axis 26.

Figure 8:
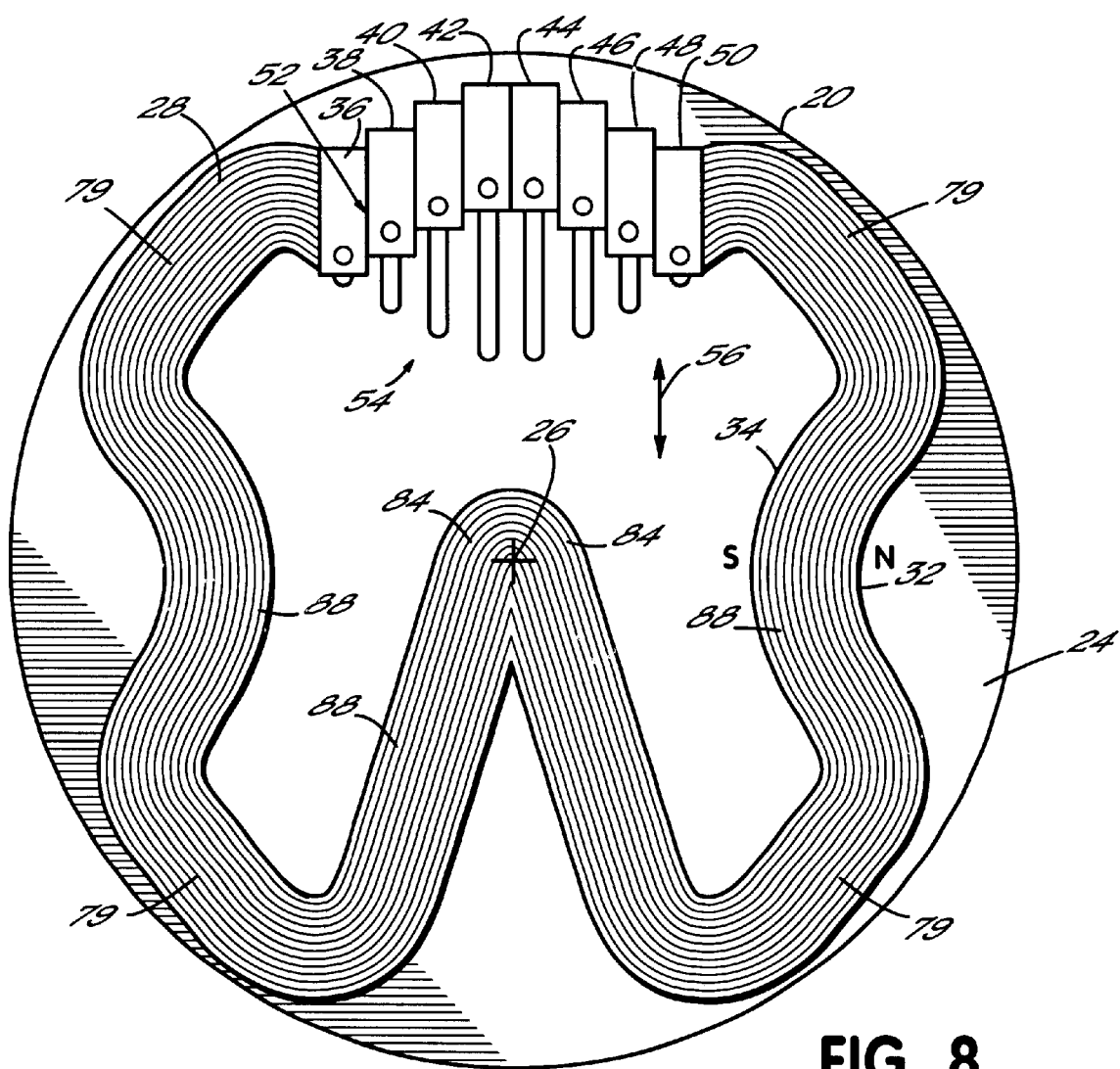
FIG. 8 is a view of the system when the yoke reaches its outermost position relative to the center axis, thus positioning the magnetic segments in an outermost area.
Figure 9:
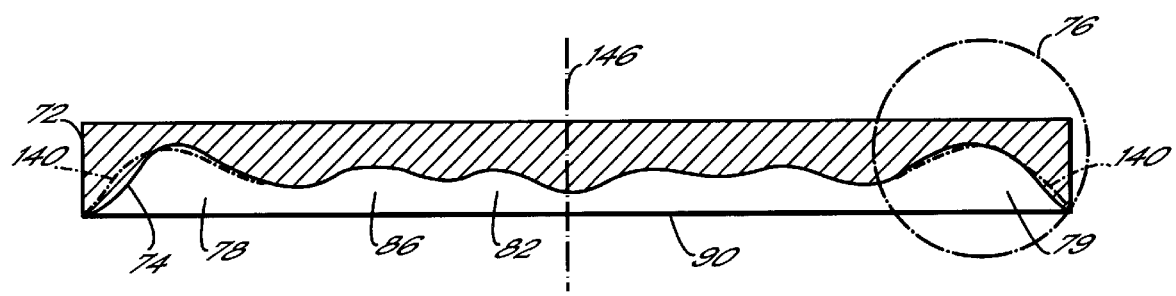
FIG. 9 illustrates an outward shift in accordance with the present invention of an outermost portion of the erosion profile shown in FIG. 2.
Figure 10:
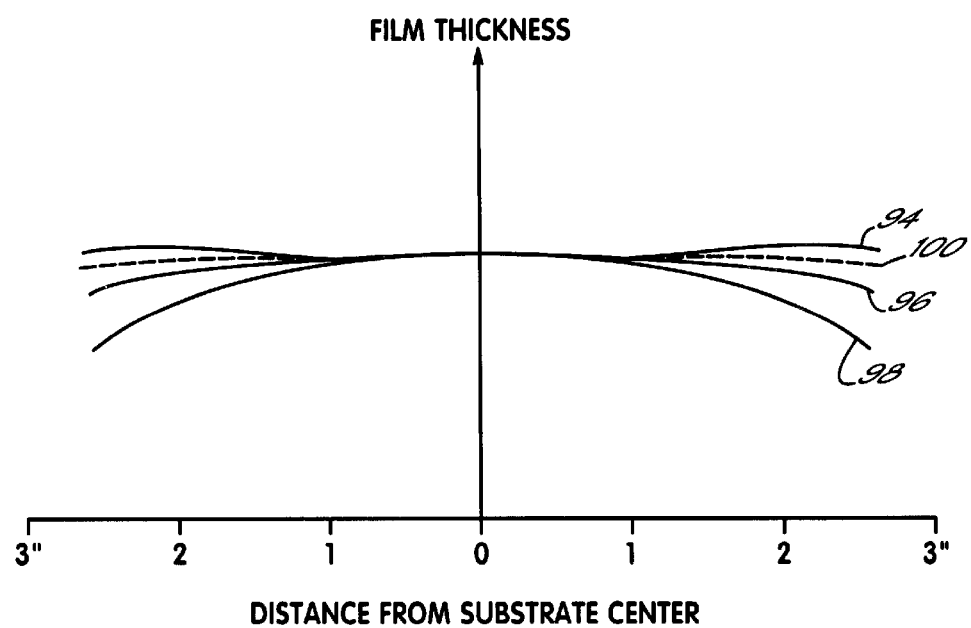
FIG. 10 illustrates a curve which shows improved film uniformity due to outward positioning of the magnetic segments.

As the fourth target 144 erodes, yoke 58 is progressively moved outward and away from the center axis 26. When this occurs, pins 52 associated with magnetic segments 42, 44 will initially engage upper surface 62 and will be moved away from axis 26. As yoke 58 continues moving outward, yoke 58 sequentially engages pins 52 associated with magnetic segments 40,46, then magnetic segments 38,48 and finally, with magnetic segments 36,50. Referring to FIG. 8, when yoke 58 reaches its outermost position, magnetic segments 36–50 are located closest to the center axis 26 with magnetic segments 38,48 and 40,46 being located progressively further away and magnetic segments 42,44 being located the furthest from the center axis 26 to form an arc shaped configuration. In accordance with the present invention, as the magnetic segments 36–50 are progressively moved outward, the degree of rotational dwell along the edges of fourth target 144 increases. Referring to FIG. 9, the effect of increasing rotational dwell is depicted with respect to the previously described first target 72 for purposes of comparison. In particular, increasing rotational dwell causes an outward shift in the erosion pattern formed on the first target 72 to form a second outermost portion 140 (indicated by dashed line) which is further from the center axis 26 than the first outermost portion 78. Referring to FIG. 10, this ultimately results in film thickness uniformity as illustrated by curve 100 (shown as dashed line) which is substantially improved over that of either curve 96 (mid-point of target life) or curve 98 (approaching end of target life) and which approximates that of a new target (curve 94).

Referring again to FIG. 5, shaft 70 passes through stationary cover 14 and is coupled to motor 104 through an insulating coupling 102. The power supply 108, such as manufactured by Advanced Energy, Inc. provides sputtering power through cable connection 110. The system 10 also includes a controller 114 which is connected between the power supply 108 and the motor 104 by first 112 and second 116 cables, respectively. It is known that the lifetime of a given target may be expressed in terms of the total amount of energy (kilowatt-hours) it will absorb before replacement of the target is necessary. As such, the magnetic reconfiguration described herein may be automated so as to take place without operator attention. In particular, power usage is transmitted to the controller 114 which may include a microprocessor and memory for storing computer code. The computer code includes lookup tables that correlate preferred positioning of magnetic segments 36–50 for various types of sputtering targets at predetermined stages of target life. The system 10 further includes a position sensor 106 for detecting the position of the shaft 70. This information is also provided to controller 114. Controller 114 then causes activation of motor 104 so as to suitably adjust positioning of yoke 46 via shaft 70 as fourth target 144 erodes. This enables outward movement of the magnetic segments 36–50 as previously described so as to increase rotational dwell near the edge of the fourth target 144 in order to improve film uniformity. Alternatively, motor 104 may be a stepper motor and magnetic segments 36–50 may be incrementally adjusted periodically in response to signals generated by controller 114 without reference to sputtering power in an open loop manner.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed. For example, other forms of magnets and mechanisms may be used. In particular, with certain magnet configurations stationary magnets may be used with moving shunts or pole pieces to achieve the same effect.

What is claimed is:

1. A sputtering system for depositing a thin film onto a substrate comprising:
    an evacuatable chamber;
    a substrate within the chamber;
    a target positioned within the chamber and having a back surface and a sputtering surface;
    means for producing a plasma for eroding said target to provide material for forming said thin film wherein erosion of the target occurs in an erosion pattern determined by the shape of the plasma;
    permanent magnet structure behind the back surface of the target providing a magnetic field over the sputtering surface of the target, the magnet structure having a configuration which determines the shape of the plasma, the configuration including an irregular loop formed at least in part of moveable permanent magnet segments; and
    a controller operable to adjust the moveable magnet segments from an initial position early in the life of the target to a different position so as to vary the shape of the plasma as the target erodes in the course of the life of the target.

2. The system of claim 1 in which the loop has a gap therein and wherein the moveable permanent magnet segments are positioned in the gap at various radii from a center of the magnet structure.

3. The system of claim 2 wherein the controller includes positioning means for engaging the segments and progressively moving segments from an initial position to a subsequent position to change the shape of the plasma and thereby change the erosion pattern as the target erodes in the course of its life.

4. The system of claim 1 wherein the controller is operable to reposition at least one of said magnetic segments to provide a dwell adjustment.

5. The system of claim 1 wherein the controller includes means for monitoring energy applied to said target and to vary the configuration in response to the monitoring of the energy.

6. A method of sputtering a substantially uniform layer of sputtered material onto a substrate, comprising the steps of:

providing a magnetic assembly in proximity to a sputtering target and configured to provide a magnetic field tunnel having a first shape on a face of the sputtering target;

generating a plasma and eroding therewith the sputtering target;

determining changes in the state of erosion of the target;

moving a portion of the magnetic assembly in accordance with the determined changes in the state of erosion to change the shape of the tunnel from an initial position to a subsequent position to and thereby change the shape of the plasma as the target erodes.

7. The method of claim 6 wherein:

the determining step includes the step of monitoring the cumulative amount of energy delivered to the sputtering target; and the moving step includes the step of altering the configuration of the magnetic assembly as a function of the cumulative amount of energy delivered to the sputtering target.

8. The method of claim 6 wherein the moving step includes the step of moving a portion of the magnetic assembly to increase dwell of the plasma at an outer portion of the sputtering target.

9. The method of claim 6 wherein the moving step further comprises the step of: moving segments of the magnetic assembly from an intermediate radius, relative to a center reference axis when the sputtering target is new, to a progressively greater radius as energy is delivered to the sputtering target over the life of the sputtering target.

10. The method of claim 6 wherein:

the determining step includes the step of providing a controller for monitoring cumulative energy provided to the sputtering target; and the moving step includes the step of changing the configuration of the magnetic assembly by progressively altering the configuration of the magnetic assembly without interrupting a process of sequentially sputter coating a series of substrates.

11. The method of claim 6 wherein:

the moving step includes the step of changing the shape of the magnetic field tunnel while applying energy to the sputtering target so as to increase an outboard rotational dwell of the magnetic field generated by said magnetic assembly.

12. A sputtering system for depositing a thin film onto a substrate comprising:

an evacuatable chamber;

a substrate within the chamber;

a target positioned within the chamber and having a back surface and a sputtering surface;

means for producing a plasma for eroding said target to provide material for forming said thin film wherein erosion of the target occurs in an erosion pattern determined by the shape of the plasma;

permanent magnet structure rotatably mounted behind the back face of the target providing a magnetic field over the sputtering surface of the target, the magnet structure having a configuration which determines the shape of the plasma, the configuration including a loop formed at least in part of moveable permanent magnet segments; and a controller operable to adjust the moveable magnet segments from an initial position early in the life of the target to a different position so as to vary the shape of the plasma as the target erodes in the course of the life of the target;

the loop having inner and outer portions and a gap, at least one magnet segment being disposed in the gap;

the controller including positioning means for engaging the magnetic segment in the gap and progressively moving the magnetic segment from an initial position to a subsequent position to change the configuration and thereby change a rotational dwell relative to the target.

13. The system according to claim 12 wherein movement of the magnetic segment in the gap is controlled by the controller in response to a monitoring of an amount of energy applied to the target.

14. The system according to claim 12 wherein the rotational dwell is increased in the outer portion of the loop.

15. The system according to claim 12 wherein the magnetic segment in the gap includes an engagement member.

16. The system according to claim 15 wherein the engagement member extends through a guide element for guiding movement of the magnetic segment in the gap, and wherein the guide element is formed in a plate supporting the permanent magnet structure.

17. The system according to claim 15 wherein the positioning means includes a yoke element engaging the engagement member.

18. The system according to claim 17 wherein the positioning means further includes a rotating shaft engageable with the yoke element to move the yoke element and thus the magnet segment.

19. The system according to claim 18 wherein the yoke element includes a pair of guiding elements contacting an end of the shaft.

* * * * *

UNITED STATES PATENT AND TRADEMARK OFFICE
CERTIFICATE OF CORRECTION

PATENT NO. : 6,464,841 B1 Page 1 of 1
DATED : October 15, 2002
INVENTOR(S) : Hurwitt It is certified that error appears in the above-identified patent and that said Letters Patent is hereby corrected as shown below:

Column 4,
Line 15, reads "to cause an 10 emission" and should read -- to cause an emission --.

Signed and Sealed this

Twenty-fifth Day of March, 2003

JAMES E. ROGAN
*Director of the United States Patent and Trademark Office*